US008689170B2

(12) United States Patent
Ellavsky et al.

(10) Patent No.: US 8,689,170 B2
(45) Date of Patent: *Apr. 1, 2014

(54) CHANGING THE LOCATION OF A BUFFER BAY IN A NETLIST

(71) Applicant: International Business Machines Corporation, Armonk, NY (US)

(72) Inventors: Matthew R. Ellavsky, Rochester, MN (US); Sean T. Evans, Rochester, MN (US); Timothy D. Helvey, Rochester, MN (US); Phillip P. Normand, Chippewa Falls, WI (US); Jason L. VanVreede, Trempealeau, WI (US); Bradley C. White, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/779,719

(22) Filed: Feb. 27, 2013

(65) Prior Publication Data
US 2013/0174114 A1 Jul. 4, 2013

Related U.S. Application Data

(63) Continuation of application No. 13/106,005, filed on May 12, 2011, now Pat. No. 8,413,104.

(51) Int. Cl.
*G06F 17/50* (2006.01)
*G06F 9/455* (2006.01)

(52) U.S. Cl.
USPC ........... 716/139; 716/108; 716/113; 716/119; 716/132; 716/134

(58) Field of Classification Search
USPC .................. 716/108, 113, 119, 132, 134, 139
See application file for complete search history.

(56) References Cited

U.S. PATENT DOCUMENTS

| 6,401,234 | B1 | 6/2002 | Alpert et al. |
| 6,944,842 | B1 * | 9/2005 | Trimberger .................... 716/114 |
| 6,996,512 | B2 | 2/2006 | Alpert et al. |
| 7,707,530 | B2 | 4/2010 | Alpert et al. |
| 2003/0212976 | A1 | 11/2003 | Drumm |
| 2004/0221253 | A1 | 11/2004 | Imper et al. |
| 2008/0288905 | A1 | 11/2008 | Alpert et al. |
| 2009/0031269 | A1 | 1/2009 | Chen et al. |
| 2010/0257498 | A1 | 10/2010 | Alpert et al. |

* cited by examiner

*Primary Examiner* — Nghia Doan
(74) *Attorney, Agent, or Firm* — Owen J. Gamon; Matthew C. Zehrer

(57) ABSTRACT

In an embodiment, a buffer bay is represented with a moveable object that has a location within a unit in a netlist. The location of the moveable object that represents the buffer bay is changed to a new location in the netlist if changing the location improves placement within the unit. In an embodiment, a net weight of a net that connects the moveable object to an artificial pin is considered in determining whether to change the location to the new location. In an embodiment a bounding area that encompasses the location is considered in determining whether to change the location to the new location.

14 Claims, 6 Drawing Sheets

CHANGING THE LOCATION OF A BUFFER BAY IN A NETLIST

CROSS REFERENCE TO RELATED APPLICATIONS

This is a continuation application of U.S. patent application Ser. No. 13/106,005, filed May 12, 2011, to Matthew R. Ellaysky, et al., entitled "CHANGING THE LOCATION OF A BUFFER BAY IN A NETLIST," which is herein incorporated by reference.

FIELD

An embodiment of the invention generally relates to designing electrical circuits and more particularly to the locations of buffer bays in a netlist that specifies the design of an electrical circuit.

BACKGROUND

Computer systems and other electronic devices typically comprise integrated circuits, which may comprise semiconductors, transistors, wires, programmable logic devices, and programmable gate arrays, and which may be organized into chips, circuit boards, storage devices, and processors, among others.

The automated design of integrated circuits requires specification of a logic circuit by a designer. One technique for physically designing digital integrated logic circuits is known as the standard cell technique, in which physical layouts and timing behavior models are created for simple logic functions such as AND, OR, NOT, or FlipFlop. These physical layouts are known as "standard cells." A large group of pre-designed standard cells is then assembled into a standard cell library, which is typically provided by a fabrication vendor who will eventually produce the actual chip that comprises the logic circuit. Examples of these standard cell libraries are available from fabrication vendors such as TSMC (Taiwan Semiconductor Manufacturing Company) or UMC (United Microelectronics Corporation). Automated tools available from companies such as Cadence Design Systems and Synopsys read a netlist description of the integrated circuit, or netlist representing the desired logical functionality for a chip (sometimes referred to as a behavioral or register-transfer-level description), and map it into an equivalent netlist composed of standard cells from the selected standard cell library. This process is commonly known as "synthesis."

A netlist is a data structure representation of the electronic logic system that comprises a set of modules, each of which comprises a data structure that specifies subcomponents and their interconnection via wires, which are commonly called "nets." The netlist describes the way in which standard cells and blocks are interconnected. Netlists are typically available in VERILOG, EDIF (Electronic Design Interchange Format), or VHDL (Very High Speed Integrated Circuit Hardware Design Language) formats.

Other tools available from companies such as Cadence or Synopsys read a netlist comprised of standard cells and create a physical layout of the chip by placing the cells relative to each other to minimize timing delays or wire lengths, then creating electrical connections (or routing) between the cells to physically complete the design of the desired circuit.

One important parameter that must be accounted for during the design of an integrated circuit is that of timing constraints. In particular, due to factors such as resistance, capacitance, and switching delays, signals that are propagated through an integrated circuit require some finite amount of time to reach various destinations. Further, often signals must reach their destinations within a certain time frame (typically before the end of a clock cycle). Otherwise, data would be missed due to its late arrival at a destination. Long interconnects tend to increase timing problems because the inherent resistance and capacitance of such long interconnects may delay the arrival of a signal at its destination beyond that which is acceptable.

One way to optimize timing is via buffer insertion into the circuit. In particular, the addition of one or more buffers into a relatively long interconnect in an integrated circuit design will typically improve the timing parameters for that interconnect, due to reduced load, reduced delay, and reduced slew, often without altering the overall length of an interconnect. Thus, by the selective addition of buffers to a design, a circuit design may be optimized to meet timing constraints.

A buffer is a special logic gate that is often manufactured to perform the same function as two inverters connected in series. An inverter is a single-input device that produces an output state opposite of the input state. Thus, if the input to the inverter is high, the output is low, and vice versa. A weak signal source (one that is not capable of sourcing or sinking very much current to a load) may be boosted by means of two inverters connected in series. By connecting the two inverters in series, the logic level of the output of the second inverter is unchanged from the logic level of the input of the first inverter in the series, but the signal is boosted or amplified. Locations at which buffers may be added are known as buffer bays.

SUMMARY

A computer-readable storage medium and computer system are provided. In an embodiment, a buffer bay is represented with a moveable object that has a location within a unit in a netlist. The location of the moveable object that represents the buffer bay is changed to a new location in the netlist if changing the location improves placement within the unit. In an embodiment, a net weight of a net that connects the moveable object to an artificial pin is considered in determining whether to change the location to the new location. In an embodiment, a bounding area that encompasses the location is considered in determining whether to change the location to the new location.

It is to be noted, however, that the appended drawings illustrate only example embodiments of the invention, and are therefore not considered a limitation of the scope of other embodiments of the invention.

DETAILED DESCRIPTION

Figure 1:
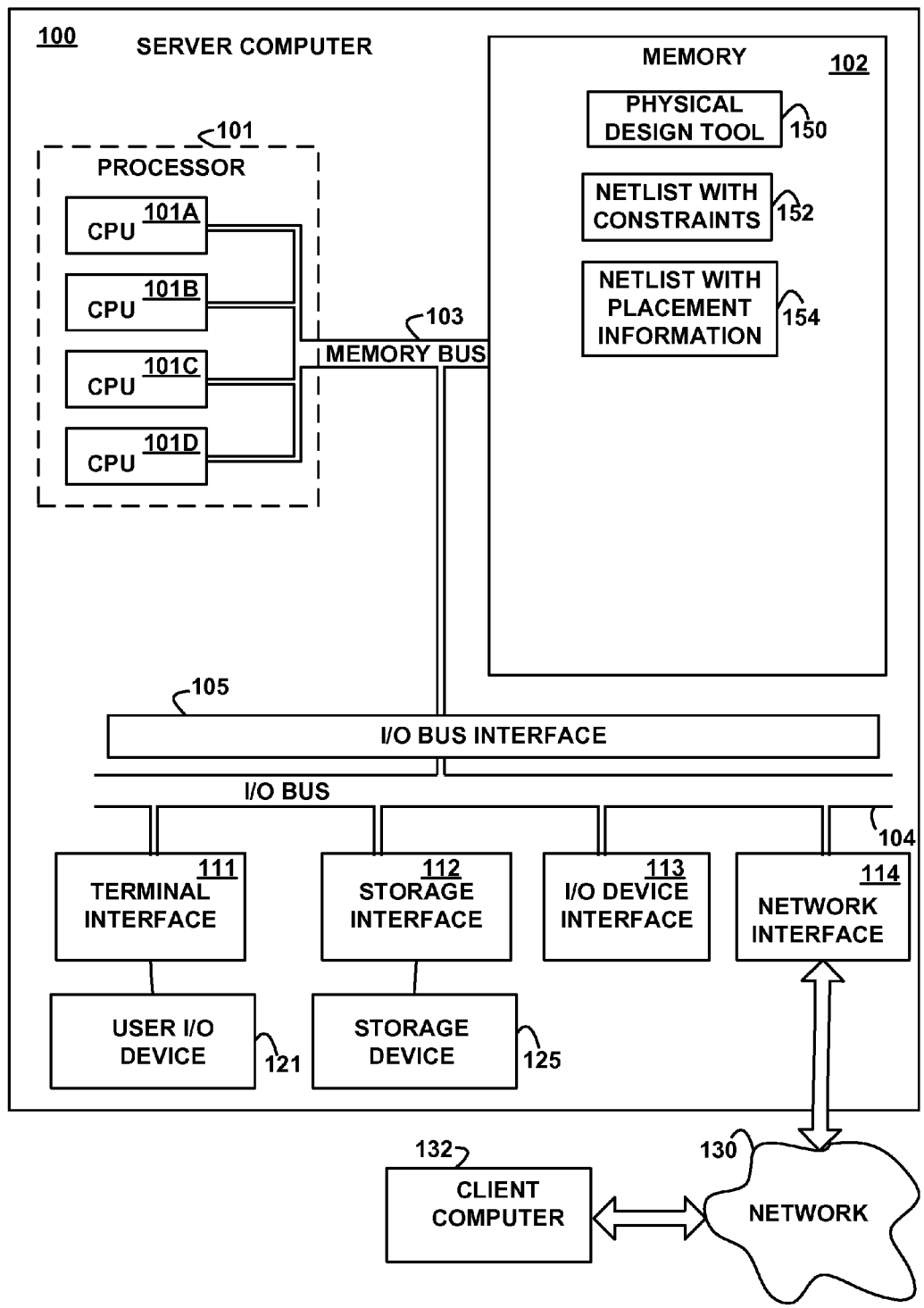
FIG. 1 depicts a high-level block diagram of an example system for implementing an embodiment of the invention.

Referring to the Drawings, wherein like numbers denote like parts throughout the several views, FIG. 1 depicts a high-level block diagram representation of a server computer system 100 connected to a client computer system 132 via a network 130, according to an embodiment of the present invention. The term "server" is used herein for convenience only, and in various embodiments a computer system that operates as a client computer in one environment may operate as a server computer in another environment, and vice versa. The mechanisms and apparatus of embodiments of the present invention apply equally to any appropriate computing system.

The major components of the computer system 100 comprise one or more processors 101, a memory 102, a terminal interface 111, a storage interface 112, an I/O (Input/Output) device interface 113, and a network adapter 114, all of which are communicatively coupled, directly or indirectly, for inter-component communication via a memory bus 103, an I/O bus 104, and an I/O bus interface unit 105.

The computer system 100 contains one or more general-purpose programmable central processing units (CPUs) 101A, 101B, 101C, and 101D, herein generically referred to as the processor 101. In an embodiment, the computer system 100 contains multiple processors typical of a relatively large system; however, in another embodiment the computer system 100 may alternatively be a single CPU system. Each processor 101 executes instructions stored in the memory 102 and may comprise one or more levels of on-board cache.

In an embodiment, the memory 102 may comprise a random-access semiconductor memory, storage device, or storage medium for storing or encoding data and programs. In another embodiment, the memory 102 represents the entire virtual memory of the computer system 100, and may also include the virtual memory of other computer systems coupled to the computer system 100 or connected via the network 130. The memory 102 is conceptually a single monolithic entity, but in other embodiments the memory 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The memory 102 is encoded with or stores a physical design tool 150, a netlist with constraints 152, and a netlist with placement information 154. Although the physical design tool 150, the netlist with constraints 152, and the netlist with placement information 154 are illustrated as being contained within the memory 102, in other embodiments some or all of them may be on different computer systems and may be accessed remotely, e.g., via the network 130. The computer system 100 may use virtual addressing mechanisms that allow the programs of the computer system 100 to behave as if they only have access to a large, single storage entity instead of access to multiple, smaller storage entities. Thus, the physical design tool 150, the netlist with constraints 152, and the netlist with placement information 154 are not necessarily all completely contained in the same storage device at the same time. Further, although the physical design tool 150, the netlist with constraints 152, and the netlist with placement information 154 are illustrated as being separate entities, in other embodiments some of them, portions of some of them, or all of them may be packaged together.

The physical design tool 150 accepts and reads the netlist with constraints 152 as input and produces and stores the netlist with placement information 154 as output. A netlist is a data structure representation of an electronic logic system. The netlist specifies electrical units and the way in which the electrical units are interconnected. The netlist with constraints 152 specifies restrictions on the physical layout of the electronic logic system. An example of a constraint is that the output signal from a particular OR gate may only be valid some distance (e.g., one centimeter) from that OR gate, so that an OR gate is not allowed to connect to a net (a wire) that is longer than some distance (e.g., one centimeter). Another example of a constraint is the specification of a placement boundary area, outside of which a moveable object may not be moved. In other embodiments, any appropriate constraint may be specified. The netlist with placement information 154 specifies, to a mask fabricator, the electronic units and the locations at which the mask fabricator locates or places the electronic units on a die. A die is a block of semiconducting material, onto which the mask fabricator fabricates the circuit.

In an embodiment, the physical design tool 150 comprises instructions or statements that execute on the processor 101 or instructions or statements that are interpreted by instructions or statements that execute on the processor 101, to carry out the functions as further described below with reference to FIGS. 2, 3, 4, 5, 6, and 7. In another embodiment, the physical design tool 150 is implemented in hardware via semiconductor devices, chips, logical gates, circuits, circuit cards, and/or other physical hardware devices in lieu of, or in addition to, a processor-based system. In an embodiment, the physical design tool 150 comprises data in addition to instructions or statements.

The memory bus 103 provides a data communication path for transferring data among the processor 101, the memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104.

The I/O interface units support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer system 100, and may receive output data via the user output devices. For example, a user interface may be presented via the user I/O device 121, such as displayed on a display device, played via a speaker, or printed via a printer.

The storage interface unit 112 supports the attachment of one or more disk drives or direct access storage devices 125 (which are typically rotating magnetic disk drive storage devices, although they could alternatively be other storage devices, including arrays of disk drives configured to appear as a single large storage device to a host computer). In another embodiment, the storage device 125 may be implemented via any type of secondary storage device. The contents of the memory 102, or any portion thereof, may be stored to and retrieved from the storage device 125, as needed. The I/O device interface 113 provides an interface to any of various other input/output devices or devices of other types, such as printers or fax machines. The network adapter 114 provides one or more communications paths from the computer system 100 to other digital devices and computer systems 132; such paths may comprise, e.g., one or more networks 130.

Although the memory bus 103 is shown in FIG. 1 as a relatively simple, single bus structure providing a direct communication path among the processors 101, the memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 105 and the I/O bus 104 are shown as single respective units, the computer system 100 may, in fact, contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

In various embodiments, the computer system 100 is a multi-user mainframe computer system, a single-user system, or a server computer or similar device that has little or no direct user interface, but receives requests from other computer systems (clients). In other embodiments, the computer system 100 is implemented as a desktop computer, portable computer, laptop or notebook computer, tablet computer, pocket computer, telephone, smart phone, pager, automobile, teleconferencing system, appliance, or any other appropriate type of electronic device.

The network 130 may be any suitable network or combination of networks and may support any appropriate protocol suitable for communication of data and/or code to/from the computer system 100 and the computer system 132. In various embodiments, the network 130 may represent a storage device or a combination of storage devices, either connected directly or indirectly to the computer system 100. In another embodiment, the network 130 may support wireless communications. In another embodiment, the network 130 may support hard-wired communications, such as a telephone line or cable. In another embodiment, the network 130 may be the Internet and may support IP (Internet Protocol). In another embodiment, the network 130 is implemented as a local area network (LAN) or a wide area network (WAN). In another embodiment, the network 130 is implemented as a hotspot service provider network. In another embodiment, the network 130 is implemented an intranet. In another embodiment, the network 130 is implemented as any appropriate cellular data network, cell-based radio network technology, or wireless network. In another embodiment, the network 130 is implemented as any suitable network or combination of networks. Although one network 130 is shown, in other embodiments any number of networks (of the same or different types) may be present.

The client computer 132 may comprise some or all of the hardware and computer program elements of the server computer 100. The client computer 132 may also comprise additional elements not illustrated for the server computer 100.

FIG. 1 is intended to depict the representative major components of the server computer system 100, the network 130, and the client computer 132. But, individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program components illustrated in FIG. 1 and implementing various embodiments of the invention may be implemented in a number of manners, including using various computer applications, routines, components, programs, objects, modules, data structures, etc., and are referred to hereinafter as "computer programs," or simply "programs."

The computer programs comprise one or more instructions or statements that are resident at various times in various memory and storage devices in the server computer system 100 and that, when read and executed by one or more processors in the server computer system 100 or when interpreted by instructions that are executed by one or more processors, cause the server computer system 100 to perform the actions necessary to execute steps or elements comprising the various aspects of embodiments of the invention. Aspects of embodiments of the invention may be embodied as a system, method, or computer program product. Accordingly, aspects of embodiments of the invention may take the form of an entirely hardware embodiment, an entirely program embodiment (including firmware, resident programs, micro-code, etc., which are stored in a storage device) or an embodiment combining program and hardware aspects that may all generally be referred to herein as a "circuit," "module," or "system." Further, embodiments of the invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium, may be, for example, but not limited to, an electronic, magnetic, optical, electromagnetic, infrared, or semiconductor system, apparatus, or device, or any suitable combination of the foregoing. More specific examples (an non-exhaustive list) of the computer-readable storage media may comprise: an electrical connection having one or more wires, a portable computer diskette, a hard disk (e.g., the storage device 125), a random access memory (RAM) (e.g., the memory 102), a read-only memory (ROM), an erasable programmable read-only memory (EPROM) or Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may comprise a propagated data signal with computer-readable program code embodied thereon, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that communicates, propagates, or transports a program for use by, or in connection with, an instruction execution system, apparatus, or device. Program code embodied on a computer-readable medium may be transmitted using any appropriate medium, including but not limited to, wireless, wire line, optical fiber cable, radio frequency, or any suitable combination of the foregoing.

Computer program code for carrying out operations for aspects of embodiments of the present invention may be written in any combination of one or more programming languages, including object oriented programming languages and conventional procedural programming languages. The program code may execute entirely on the user's computer, partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments of the invention are described below with reference to flowchart illustrations and/or block diagrams of methods, apparatus (systems), and computer program products. Each block of the flowchart illustrations and/or block diagrams, and combinations of blocks in the flowchart illustrations and/or block diagrams may be implemented by computer program instructions embodied in a computer-readable medium. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified by the flowchart and/or block diagram block or blocks. These computer program instructions may also be stored in a computer-readable medium that can direct a computer, other programmable data processing apparatus, or other devices to function in a particular manner, such that the instructions stored in the computer-readable medium produce an article of manufacture, including instructions that implement the function/act specified by the flowchart and/or block diagram block or blocks.

The computer programs defining the functions of various embodiments of the invention may be delivered to a computer system via a variety of tangible computer-readable storage media that may be operatively or communicatively connected (directly or indirectly) to the processor or processors. The computer program instructions may also be loaded onto a computer, other programmable data processing apparatus, or other devices to cause a series of operational steps to be performed on the computer, other programmable apparatus, or other devices to produce a computer-implemented process, such that the instructions, which execute on the computer or other programmable apparatus, provide processes for implementing the functions/acts specified in the flowcharts and/or block diagram block or blocks.

The flowchart and the block diagrams in the figures illustrate the architecture, functionality, and operation of possible implementations of systems, methods, and computer program products, according to various embodiments of the present invention. In this regard, each block in the flowcharts or block diagrams may represent a module, segment, or portion of code, which comprises one or more executable instructions for implementing the specified logical function(s). In some embodiments, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flow chart illustrations, can be implemented by special purpose hardware-based systems that perform the specified functions or acts, in combinations of special purpose hardware and computer instructions.

Embodiments of the invention may also be delivered as part of a service engagement with a client corporation, non-profit organization, government entity, or internal organizational structure. Aspects of these embodiments may comprise configuring a computer system to perform, and deploying computing services (e.g., computer-readable code, hardware, and web services) that implement, some or all of the methods described herein. Aspects of these embodiments may also comprise analyzing the client company, creating recommendations responsive to the analysis, generating computer-readable code to implement portions of the recommendations, integrating the computer-readable code into existing processes, computer systems, and computing infrastructure, metering use of the methods and systems described herein, allocating expenses to users, and billing users for their use of these methods and systems.

In addition, various programs described hereinafter may be identified based upon the application for which they are implemented in a specific embodiment of the invention. But, any particular program nomenclature that follows is used merely for convenience, and thus embodiments of the invention are not limited to use solely in any specific application identified and/or implied by such nomenclature. The exemplary environments illustrated in FIG. 1 are not intended to limit the present invention. Indeed, other alternative hardware and/or program environments may be used without departing from the scope of embodiments of the invention.

Figure 2:
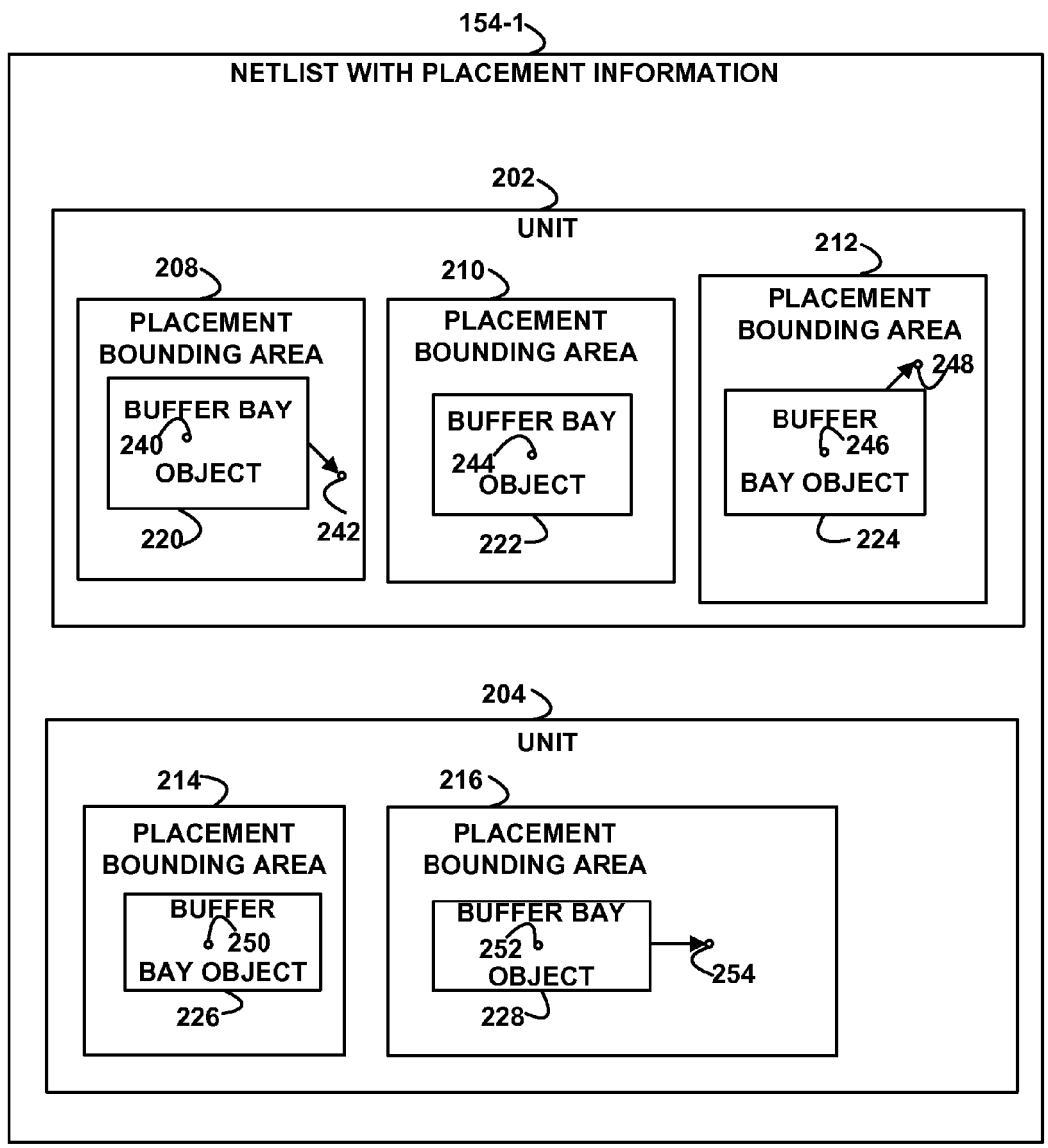
FIG. 2 depicts a block diagram of an example netlist with placement information and placement bounding areas, according to an embodiment of the invention.

FIG. 2 depicts a block diagram of an example netlist 154-1 with placement information and placement bounding areas, according to an embodiment of the invention. The netlist 154-1 is an example of, and is generically referred to by, the netlist 154 (FIG. 1). The example netlist 154-1 comprises example units 202 and 204. In various embodiments, units may specify modules, components, subcomponents, standard cells, blocks, macros, tiles, chips, transistors, vias, logic gates, or any multiple or combination thereof.

The units may be organized into a hierarchy of levels, with a lower level of hierarchy being enclosed (both physically and logically) by a higher level of hierarchy. In an embodiment, the lowest level of hierarchy comprises, e.g., transistors and other elements, the next highest level comprises, e.g., logic gates, which comprise the transistors, the next highest level comprises, e.g., macros or tiles, which comprise the logic gates, and the next highest level comprises, e.g., a chip, which comprises multiple macros or tiles. But, in other embodiments, any number of levels of hierarchy may be present, and the levels of hierarchy may comprise any appropriate units.

The example unit 202 comprises a buffer bay object 220 located or placed at a location 240 within or encompassed by a placement bounding area 208, a buffer bay object 222 located or placed at a location 244 within a placement bounding area 210, and a buffer bay object 224 located or placed at a location 246 within a placement bounding area 212. The example unit 204 comprises a buffer bay object 226 located or placed at a location 250 within a placement bounding area 214 and a buffer bay object 228 located or placed at a location 252 within a placement bounding area 216.

The buffer bay objects 220, 222, 224, 226, and 228 are placeable and moveable objects created from, or that represent, buffer bays, which are locations that are pre-assigned and not moveable. The buffer bay objects 220, 222, 224, 226, and 228 specify a non-functional logic gate or circuit, meaning a gate or circuit that performs no electrical or logical function within the logic design specified by the netlist with placement information 154-1. Examples of a non-functional circuit include filler cells or filler circuits, also known as empty cells. A filler circuit is a circuit that physically exists in some semiconductor and metal layers, performs neither electrical nor logic functions, and does not block all layers. The buffer bay objects 220, 222, 224, 226, and 228 only exist in the netlist with placement information 154-1 and do not exist in the physical chip created by the mask fabricator. The buffer bay objects 220, 222, 224, 226, and 228 reserve area for and model the blockage of all layers used by buffer bays.

The placement bounding areas 208, 210, 212, 214, and 216 (also known as move bounds or fences) comprise edges located a specified distance from the initial buffer bay object location. The placement bounding areas 208, 210, 212, 214, and 216 encompass or surround the respective buffer bay object locations 240, 244, 246, 250, and 252. The edges of the placement bounding areas limit the area where the physical design tool 150 may move or place the respective buffer bay object 220, 222, 224, 226, or 228 that is contained within the edges of the respective placement bounding area 208, 210, 212, 214, or 216. In various embodiments, the placement bounding areas 208, 210, 212, 214, and 216 may be specified as rectangles or polygons.

Thus, e.g., the buffer bay object 220 may be moved from the location 240 within the placement bounding area 208 to the new location 242, also within the placement bounding area 208, but may not be moved to a location that is outside the edges of the placement bounding area 208. Similarly, e.g., the buffer bay object 224 may be moved from the location 246 within the placement bounding area 212 to the new location 248, also within the placement bounding area 212, but may not be moved to a location, such as the location 242, that is outside the edges of the placement bounding area 212. Similarly, e.g., the buffer bay object 228 may be moved from the location 252 within the placement bounding area 216 to the new location 254, also within the placement bounding area 216, but may not be moved to a location that is outside the edges of the placement bounding area 216.

A placement algorithm, implemented by the physical design tool 150, obeys, conforms to, or enforces the placement bounding areas 208, 210, 212, 214, and 216 when moving or changing the location of the buffer bay objects 220, 222, 224, 226, and 228. One reason that the physical design tool 150 may decide to move a buffer bay object 220, 222, 224, 226, or 228 is if the buffer bay object 220, 222, 224, 226, or 228 has been placed in a congested tile or area, i.e., a tile or area in which a large number (more than a threshold number) of objects or nets have been placed or routed in a small area (an area whose size is less than a threshold amount).

Thus, during placement, the physical design tool 150 may determine if a buffer bay object 220, 222, 224, 226, or 228 has been placed in a congested location, tile, or area. If so, the physical design tool 150 checks for an adjacent location with less congestion than the current location and moves the buffer bay object 220, 222, 224, 226, and 228 to the adjacent location that is less congested than the current location if the less congested location is within the placement bounding area that encompasses the location of the respective buffer bay object 220, 222, 224, 226, and 228. If the current tile or area is not congested, then the physical design tool 150 does not move the buffer bay object 220, 222, 224, 226, and 228 to another tile or area. If the less congested location is not within the placement bounding area of the buffer bay object 220, 222, 224, 226, and 228, then the physical design tool 150 does not move the respective buffer bay object 220, 222, 224, 226, and 228 to the less congested location.

Figure 3:
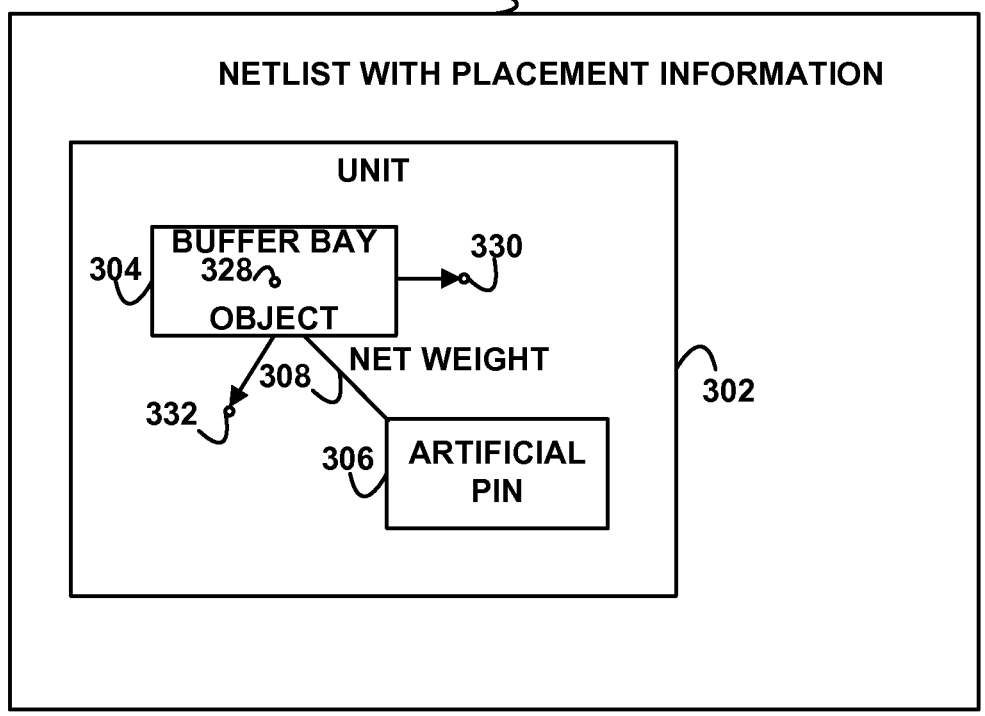
FIG. 3 depicts a block diagram of an example netlist with placement information and an artificial pin, according to an embodiment of the invention.

FIG. 3 depicts a block diagram of an example netlist with placement information 154-2 and an artificial pin 306, according to an embodiment of the invention. The netlist 154-2 is an example of, and is generically referred to by, the netlist 154 (FIG. 1). The netlist 154-2 comprises any number of units, such as the example unit 302, which comprises any number of buffer bay objects and artificial pins, such as the example buffer bay object 304 (located at the location 328 within the unit 302) connected to the artificial pin 306 via the net 308. In another embodiment, the artificial pin 306 is implemented as an artificial port. In various embodiments, a pin is an input or output wire of a logic gate or other component.

The artificial pin 306 is denominated "artificial" because the artificial pin 306 is not part of the circuit design represented by the netlist 154-2 and the physical design tool 150 creates the artificial pin 306, uses the artificial pin 306 to create placement information in the netlist 154-2, and then removes the artificial pin 306 from the netlist 154-2 prior to sending the netlist 154-2 to the mask fabricator that creates the physical circuit or chip specified by the netlist 154-2. Thus, the artificial pin 306 is not present in the physical circuit or chip fabricated by the mask fabricator, and the artificial pin 306 is not part of, or is not connected to, a logic gate.

The physical design tool 150 creates the buffer bay object 304, the artificial pin 306, and the net 308, and connects the buffer bay object 304 to the artificial pin 306 via the net 308. The physical design tool 150 further assigns a net weight to the net 308. In determining placement of circuits, such as the buffer bay object 304, the physical design tool 150 uses the net weight of the net 308, as well as net weights for other nets, to prioritize placement of the buffer bay object 304, relative to the placement of other elements and other units. For example, the physical design tool 150 may decide to keep the buffer bay object 304 at the location 328 or may decide to move the buffer bay object 304 to another location, such as the locations 330 or 332 within the unit 302 based on the net weight.

The physical design tool 150 uses nets weights to characterize the priority of nets, components, and pins in paths. In an embodiment, based on the slack value for a path, the physical design tool 150 may assign to nets a net weight to reflect, or that is proportional to, the timing criticality of the path. A path is a geometric description of the interconnect between a set of endpoints of one or more nets. Each path is associated with a path delay or timing delay. In an embodiment, the timing criticality of a path reflects the degree to which the path falls below a criticality threshold value based on slack. Slack of a path is the time to propagate a signal through the path minus the time that the designer of the circuit set as a design goal for the path. In other embodiments, the physical design tool 150 may use any appropriate technique to assign net weights. In an embodiment, the physical design tool 150 combines various net weights into composite net weights, yielding a composite net weight for each net, which indicates the placement priority of that net relative to other nets. The physical design tool 150 then gives priority to the nets with the highest net weights or the highest composite net weight when placing the net, so that the physical design tool 150 accommodates critical timing paths and reduces congestion.

In an embodiment, a higher priority net weight (higher than other net weights that are assigned to nets within a threshold distance of the buffer bay object 304) increases the probability that the physical design tool 150 constrains the placement of the buffer bay object 304 to an area near (within a threshold radius from) the ideal location represented by the artificial pin 306 connected to the buffer bay object 304, i.e. the higher priority net weight increases the probability that the physical design tool 150 does not move the buffer bay object 304 away from the ideal location represented by the artificial pin 306 connected to the buffer bay object 304. Similarly, a lower priority net weight (lower than the higher priority net weight or other net weights that are assigned to nets within a threshold distance of the buffer bay object 304) decreases the probability that the physical design tool 150 constrains the placement of the buffer bay object 304 to an area near the ideal location represented by the artificial pin 306 connected to the buffer bay object 304, i.e. the lower priority net weight increases the probability that the physical design tool 150 moves the buffer bay object 304 away from the ideal location represented by the artificial pin 306 connected to the buffer bay object 304.

Figure 4:
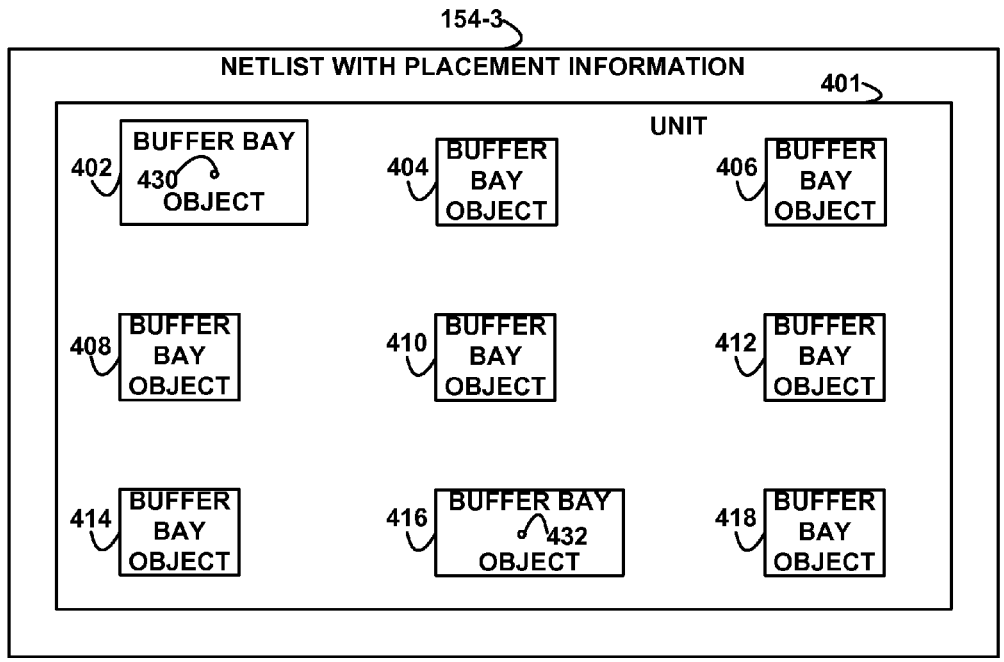
FIG. 4 depicts a block diagram of an example netlist with placement information prior to changing the location of buffer bay objects, according to an embodiment of the invention.

FIG. 4 depicts a block diagram of an example netlist 154-3 with placement information prior to changing the location of buffer bay objects, according to an embodiment of the invention. The netlist 154-3 is an example of, and is generically referred to by, the netlist 154 (FIG. 1). The netlist 154-3 comprises any number of units, such as the example unit 401, which comprises any number of buffer bay objects, such as the example buffer bay objects 402 (located at the location 430), 404, 406, 408, 410, 412, 414, 416 (located at the location 432), and 418.

Figure 5:
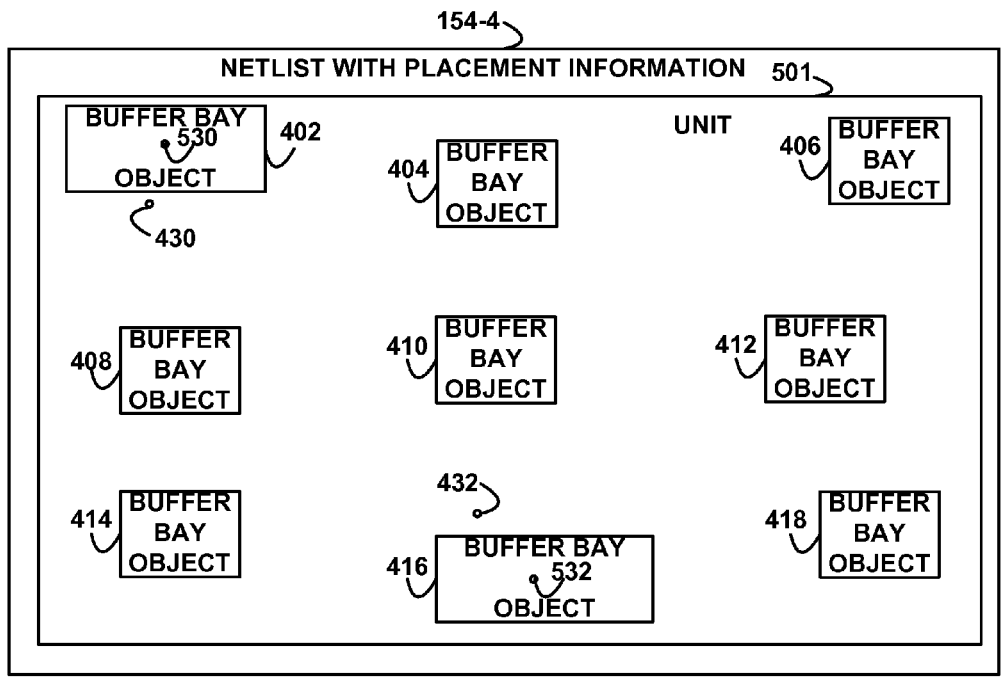
FIG. 5 depicts a block diagram of an example netlist with placement information after changing the location of buffer bay objects, according to an embodiment of the invention.

FIG. 5 depicts a block diagram of an example netlist 154-4 with placement information after changing the location of buffer bay objects, according to an embodiment of the invention. The netlist 154-4 is an example of, and is generically referred to by, the netlist 154 (FIG. 1). The netlist 154-4 comprises any number of units, such as the example unit 501, which comprises any number of buffer bay objects, such as the example buffer bay object 402 (located at the location 530, after the physical design tool 150 moved the buffer bay object 402 from the location 430, as illustrated in FIG. 4), 404, 406, 408, 410, 412, 414, 416 (located at the location 532, after the physical design tool 150 moved the buffer bay object 416 from the location 432, as illustrated in FIG. 4), and 418. Thus, the netlist 154-4 and the unit 501 of FIG. 5 represents a modification of the netlist 154-3 and the unit 401 of FIG. 4, after the physical design tool 150 moved the locations of the buffer bay objects 402 and 416 while the physical design tool 150 did not move the locations of the buffer bay objects 404, 406, 408, 410, 412, 414, and 418.

Figure 6:
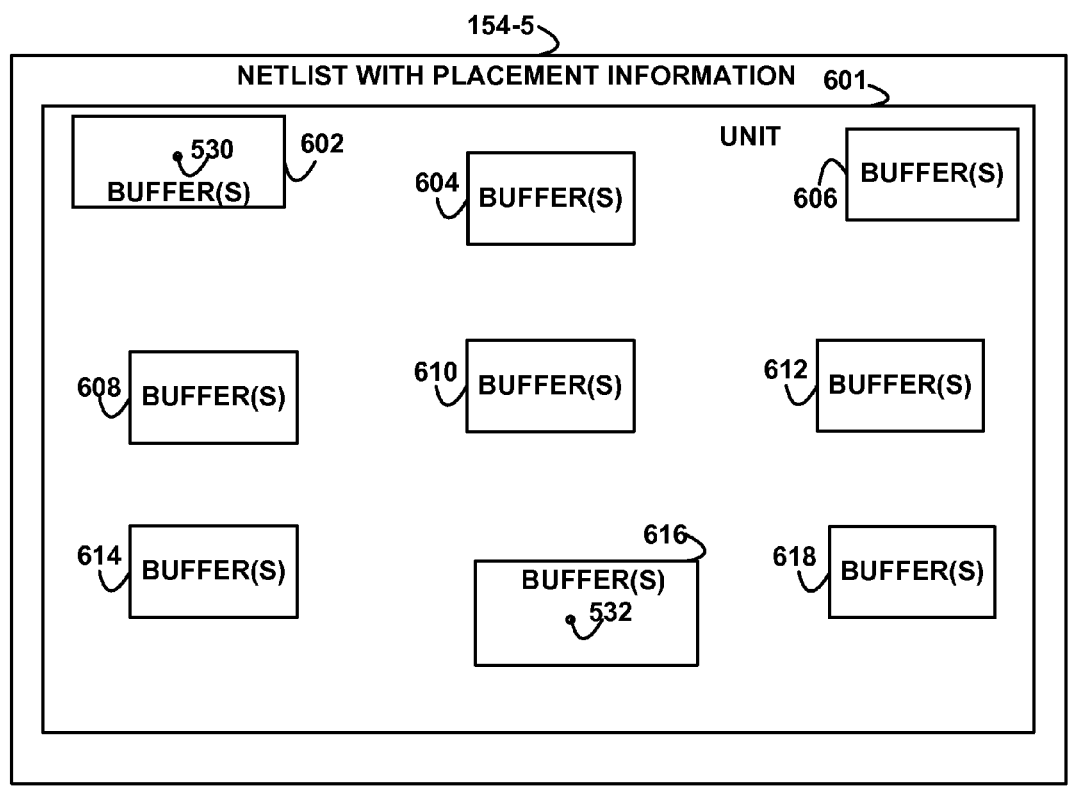
FIG. 6 depicts a block diagram of an example netlist with placement information after replacing buffer bay objects with buffers, according to an embodiment of the invention.

FIG. 6 depicts a block diagram of an example netlist 154-5 with placement information after replacing buffer bay objects with buffers, according to an embodiment of the invention. The netlist 154-5 is an example of, and is generically referred to by, the netlist 154 (FIG. 1). The netlist 154-5 comprises any number of units, such as the example unit 601, which comprises any number of buffers, such as the example buffers 602 (located at the location 530), 604, 606, 608, 610, 612, 614, 616 (located at the location 532), and 618. The physical design tool 150, or another component, replaced the buffer bay objects 402, 404, 406, 408, 410, 412, 414, 416, and 418 (FIG. 5) with the respective buffer(s) 602, 604, 606, 608, 610, 612, 614, 616, and 618, at the same respective locations.

Figure 7:
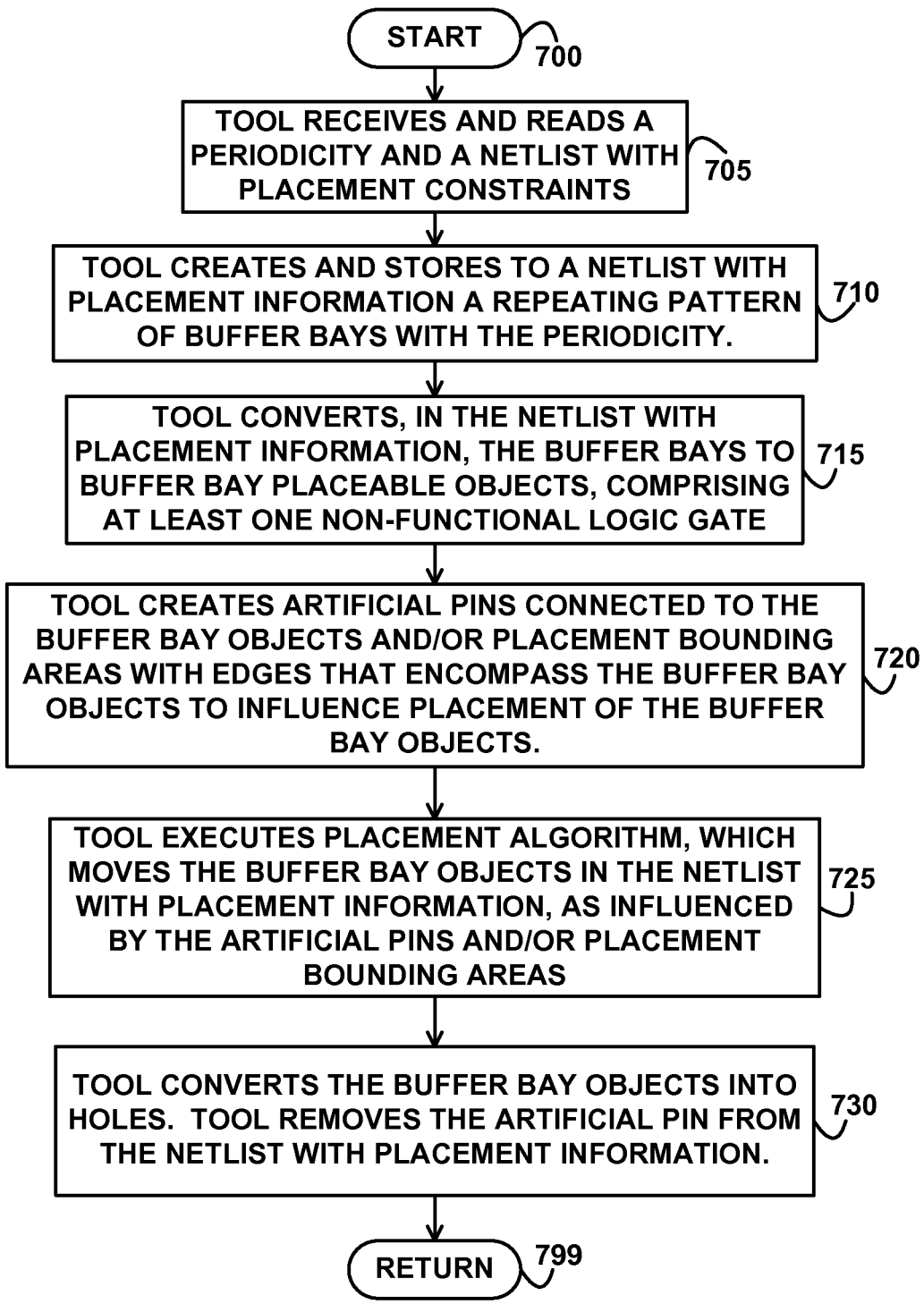
FIG. 7 depicts a flowchart of example processing for a physical design tool, according to an embodiment of the invention.

FIG. 7 depicts a flowchart of example processing for a physical design tool 150, according to an embodiment of the invention. Control begins at block 700. Control then continues to block 705 where the physical design tool 150 receives and reads a periodicity value and a netlist with constraints 152 from the user I/O device 121, from the client computer 132 via the network 130, or from an application that executes at the computer 100. In various embodiments, the periodicity value specifies initial locations in the netlist 154 for the placement of buffers and/or distances between locations where buffers are requested to be placed in the netlist 154. The periodicity of the buffers is influenced by the upper limits of the distance (minus a tolerance value) that a signal can propagate through a wire on a given level of metal while still meeting minimum signal integrity and timing constraints of the circuit being designed.

Control then continues to block 710 where the physical design tool 150 creates and stores, to the netlist with placement information 154, a repeating pattern of buffer bays at the locations specified by the periodicity value. The buffer bays are not moveable. A buffer bay represents a hole in a lower level of chip hierarchy that allows an upper level of hierarchy to utilize placement and wire resources in a confined area within the perimeter of the lower level of hierarchy. The physical design tool 150 saves, to the netlist with placement information 154, shape information that specifies the location and shape of the rectangles or polygons that describe the hole.

Control then continues to block 715 where the physical design tool 150 converts, in the netlist with placement information 154, the unmovable buffer bays into buffer bay objects, which are moveable. Thus, the physical design tool 150 represents the buffer bays with buffer bay objects. The buffer bay objects comprise at least one non-functional logic gate or circuit. Control then continues to block 720 where the physical design tool 150 creates artificial pins connected to the buffer bay objects via nets and/or creates bounding areas with edges that surround or encompass the buffer bay objects, in order to influence placement and movement of the buffer bay objects, as previously described above with reference to FIGS. 2 and 3. The physical design tool 150 assigns net weights to the nets that connect the artificial pins to the buffer bay objects, as previously described above with reference to FIG. 3.

Control then continues to block 725 where the physical design tool 150 executes a placement algorithm, which conditionally moves the buffer bay objects in the netlist with placement information 154, as influenced by and considering the artificial pins, net weights, and/or placement bounding areas if moving the buffer bay objects improves their placement, as previously described above with reference to FIGS. 2, 3, 4, and 5. The physical design tool 150 moves the buffer bay objects if moving the buffer bay objects improves their placement and does not move the buffer bay objects if moving the buffer bay objects does not improve their placement.

In an embodiment, placement is improved if moving the buffer bay objects moves them to a new location with less congestion than their current location, and placement is not improved if moving the buffer bay objects moves them to a new location with the same or more congestion than their current location. In an embodiment, placement is improved if moving the buffer bay objects moves them to a new location that is within the placement bounding area of the buffer bay objects, and placement is not improved if moving the buffer bay objects moves them to a new location outside of the bounding area of the buffer bay objects. In an embodiment, placement is improved by moving a buffer bay object from a current location to a new location if the net weight of the net that connects the buffer bay object to an artificial pin at the current location has a lower priority than the net weight of other nets near the new location (within a threshold distance from the new location), and placement is not improved by moving a buffer bay object from a current location to a new location if the net weight of the net that connects the buffer bay object to the artificial pin at the current location has a higher priority than the net weight of other nets near the new location (within a threshold distance from the new location).

Control then continues to block 730 where the physical design tool 150 converts the buffer bay objects into holes in the units. A hole in a unit is a location devoid of any circuit, component, or net. The physical design tool 150 further removes the artificial pin from the netlist with placement information 154. The physical design tool 150, or another component, may fill the holes with one or more buffers, as previously described above with reference to FIG. 6.

Control then continues to block 799 where the logic of FIG. 7 returns.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention.

In the previous description, numerous specific details were set forth to provide a thorough understanding of embodiments of the invention. But, embodiments of the invention may be practiced without these specific details. In other instances, well-known circuits, structures, and techniques have not been shown in detail in order not to obscure embodiments of the invention. Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure is not necessary. The previous detailed description is, therefore, not to be taken in a limiting sense.

What is claimed is:

1. A non-transitory computer-readable storage medium encoded with instructions, wherein the instructions when executed comprise:

representing a buffer bay with a moveable object having a location within a unit in a netlist stored in a storage device;

changing the location of the moveable object that represents the buffer bay to a new location in the netlist if changing the location improves placement within the unit, wherein the changing the location if the changing the location improves placement within the unit comprises considering a net weight in determining whether to change the location to the new location, wherein the considering the net weight in determining whether to change the location to the new location further comprises creating an artificial pin connected to the moveable object via a net;

removing the artificial pin after the changing the location; and converting the moveable object into a hole in the unit, wherein the hole is devoid of any circuit.

2. The non-transitory computer-readable storage medium of claim 1, wherein the considering the net weight in determining whether to change the location to the new location further comprises:

assigning the net weight to the net that connects the artificial pin to the moveable object.

3. The non-transitory computer-readable storage medium of claim 1, wherein the net weight that is a higher priority than net weights of other nets increases a probability that the new location of the moveable object is constrained to an area within a threshold radius from the artificial pin.

4. The non-transitory computer-readable storage medium of claim 1, wherein the changing the location if the changing the location improves placement within the unit comprises:

considering a bounding area that encompasses the location in determining whether to change the location to the new location.

5. The non-transitory computer-readable storage medium of claim 1, wherein the changing the location if the changing the location improves placement within the unit comprises:

considering routing congestion in determining whether to change the location to the new location.

6. The non-transitory computer-readable storage medium of claim 1, wherein the moveable object specifies a non-functional circuit.

7. The non-transitory computer-readable storage medium of claim 6, wherein the non-functional circuit performs no electrical function.

8. A computer comprising:

a processor; and memory communicatively coupled to the processor, wherein the memory is encoded with instructions, wherein the instructions when executed on the processor comprise representing a buffer bay with a moveable object having a location within a unit in a netlist stored in a storage device, changing the location of the moveable object that represents the buffer bay to a new location in the netlist if changing the location improves placement within the unit, wherein the changing the location if the changing the location improves placement within the unit comprises considering a net weight in determining whether to change the location to the new location, wherein the considering the net weight in determining whether to change the location to the new location further comprises creating an artificial pin connected to the moveable object via a net, removing the artificial pin after the changing the location, and converting the moveable object into a hole in the unit, wherein the hole is devoid of any circuit.

9. The computer of claim 8, wherein the considering the net weight in determining whether to change the location to the new location further comprises:

assigning the net weight to the net that connects the artificial pin to the moveable object.

10. The computer of claim 8, wherein the net weight that is a higher priority than net weights of other nets increases a probability that the new location of the moveable object is constrained to an area within a threshold radius from the artificial pin.

11. The computer of claim 8, wherein the changing the location if the changing the location improves placement within the unit comprises:
   considering a bounding area that encompasses the location in determining whether to change the location to the new location.

12. The computer of claim 8, wherein the changing the location if the changing the location improves placement within the unit comprises:
   considering routing congestion in determining whether to change the location to the new location.

13. The computer of claim 8, wherein the moveable object specifies a non-functional circuit.

14. The computer of claim 13, wherein the non-functional circuit performs no electrical function.

\* \* \* \* \*